(12) United States Patent
Chen et al.

(10) Patent No.: US 11,791,743 B2
(45) Date of Patent: Oct. 17, 2023

(54) ALTERNATOR AND RECTIFIER THEREOF FOR PREVENTING REVERSE CURRENT

(71) Applicant: ACTRON TECHNOLOGY CORPORATION, Taoyuan (TW)

(72) Inventors: Wei-Jing Chen, Taoyuan (TW); Shang-Shu Chung, Taoyuan (TW); Yen-Yi Chen, Taoyuan (TW); Huei-Chi Wang, Taoyuan (TW)

(73) Assignee: ACTRON TECHNOLOGY CORPORATION, Taoyuan (TW)

( * ) Notice: Subject to any disclaimer, the term of this patent is extended or adjusted under 35 U.S.C. 154(b) by 178 days.

(21) Appl. No.: 17/167,047

(22) Filed: Feb. 3, 2021

(65) Prior Publication Data

US 2022/0123665 A1    Apr. 21, 2022

(30) Foreign Application Priority Data

Oct. 20, 2020   (TW) ................................ 109136195

(51) Int. Cl.
| | | |
|---|---|---|
| *H02M 7/217* | (2006.01) | |
| *H02M 1/08* | (2006.01) | |
| *H02M 1/00* | (2006.01) | |
| *H03K 17/30* | (2006.01) | |
| *H02K 11/049* | (2016.01) | |

(52) U.S. Cl.
CPC .......... *H02M 7/217* (2013.01); *H02K 11/049* (2016.01); *H02M 1/0048* (2021.05); *H02M 1/08* (2013.01); *H03K 17/302* (2013.01); *H03K 2217/0081* (2013.01)

(58) Field of Classification Search
CPC .... H02M 7/217; H02M 7/219; H02M 1/0048; H02M 1/0054; H02M 1/0058
See application file for complete search history.

(56) References Cited

U.S. PATENT DOCUMENTS

| | | | | |
|---|---|---|---|---|
| 6,680,837 | B1 * | 1/2004 | Buxton | .................. H02H 3/087 |
| | | | | 327/309 |
| 7,206,208 | B1 * | 4/2007 | Hsu | ......................... H02M 1/38 |
| | | | | 363/21.06 |

(Continued)

FOREIGN PATENT DOCUMENTS

| | | |
|---|---|---|
| CN | 985427 | 6/2007 |
| TW | I692194 | 4/2020 |

*Primary Examiner* — Gustavo A Rosario-Benitez
(74) *Attorney, Agent, or Firm* — JCIPRNET (57) ABSTRACT

An alternator and a rectifier thereof are provided. The rectifier includes a transistor and a gate voltage control circuit. The transistor is controlled by a gate voltage. The gate voltage control circuit generates the gate voltage according to a voltage difference between an input voltage and a rectified voltage. During a first time interval after the voltage difference drops to a first preset threshold voltage, the gate voltage control circuit determines whether the voltage difference is less than a second preset threshold voltage, and decides whether to provide the gate voltage to turn on the transistor. When the transistor is turned on, the voltage difference substantially equals to a first reference voltage. And during a second time interval, the gate voltage control circuit regulates the gate voltage to set the voltage difference substantially to a second reference voltage.

14 Claims, 10 Drawing Sheets

(56) References Cited

U.S. PATENT DOCUMENTS

| | | | |
|---|---|---|---|
| 8,400,790 B2 * | 3/2013 | Zhang | H02M 3/33592 |
| | | | 363/127 |
| 8,427,801 B2 | 4/2013 | Goerlach et al. | |
| 9,496,800 B2 | 11/2016 | Mehringer et al. | |
| 9,960,705 B1 * | 5/2018 | Pidutti | H02M 7/217 |
| 10,079,536 B2 | 9/2018 | Ishimaru et al. | |
| 10,168,718 B1 * | 1/2019 | Kuo | H02M 1/42 |
| 2010/0060245 A1 * | 3/2010 | Namuduri | H02P 9/02 |
| | | | 318/377 |
| 2011/0234185 A1 * | 9/2011 | Nagase | H03K 17/0822 |
| | | | 323/277 |
| 2016/0315553 A1 * | 10/2016 | Ishimaru | H03K 17/163 |
| 2017/0110959 A1 * | 4/2017 | Ishimaru | H02M 1/36 |
| 2017/0302193 A1 * | 10/2017 | Zhang | H02M 7/219 |
| 2018/0321718 A1 * | 11/2018 | Kaundinya | G06F 1/206 |
| 2019/0165686 A1 * | 5/2019 | Wang | H02M 3/33592 |
| 2020/0343810 A1 * | 10/2020 | Xu | H02M 3/33592 |
| 2020/0343819 A1 * | 10/2020 | Radic | H02M 3/1588 |
| 2021/0336546 A1 * | 10/2021 | Shen | H02M 1/08 |

* cited by examiner

ALTERNATOR AND RECTIFIER THEREOF FOR PREVENTING REVERSE CURRENT

CROSS-REFERENCE TO RELATED APPLICATION

This application claims the priority benefit of Taiwan application serial no. 109136195, filed on Oct. 20, 2020. The entirety of the above-mentioned patent application is hereby incorporated by reference herein and made a part of this specification.

BACKGROUND

Technical Field

The disclosure relates to an alternator and a rectifier, particularly to an alternator and a rectifier capable of preventing reverse current.

Description of Related Art

Figure 1:
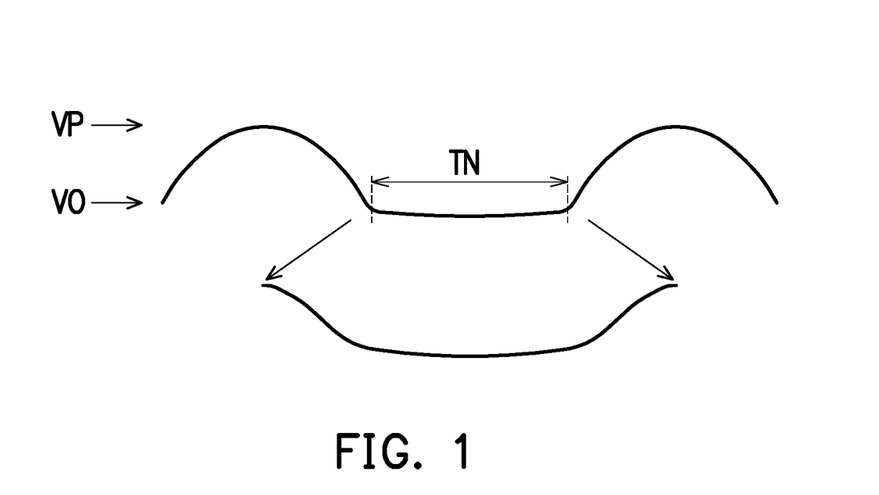
FIG. 1 is a waveform of the rectified voltage as conventionally known.

In an AC generator, a rectifier is often adapted to rectify the AC input voltage to generate a rectified voltage that can be regarded as a DC voltage. Conventionally, diodes or transistors are often adapted to rectify the input voltage. Ideally, during the negative half wave of the rectified voltage, the voltage value remains equal to the reference voltage (for example, 0 volt). However, in actual situations such as the conventionally known rectified voltage as shown in the waveform diagram of FIG. 1, the voltage value of the input voltage of the rectified voltage having a voltage VP as the peak value is less than the reference voltage VO in its negative half wave TN. In other words, power is loss in the negative half wave TN of the input voltage, decreasing the operational efficiency of the system.

In addition, there are related technologies in the prior art that perform rectification of the input voltage by controlling the timing of turning on the transistor. However, in practical applications, the waveform of the rectified voltage and the timing of turning on the transistor must be in cooperation with each other. If the timing of turning on the transistor is too late or too early, a reverse current may occur.

SUMMARY

The disclosure provides an alternator and a rectifier thereof, adapted to prevent the occurrence of reverse current during rectification.

The rectifier includes a transistor and a gate voltage control circuit. The transistor has a first end receiving an input voltage, a second end generating a rectified voltage, and a control end receiving a gate voltage. The gate voltage control circuit is coupled to the transistor and generates the gate voltage according to the voltage difference between the input voltage and the rectified voltage. During a first time interval after the voltage difference drops to a first preset threshold voltage, the gate voltage control circuit determines whether the voltage difference is less than a second preset threshold voltage, and decides whether to provide the gate voltage to turn on the transistor. When the transistor is turned on, the voltage difference substantially equals to a first reference voltage. And during a second time interval after the first time interval, the gate voltage control circuit regulates the gate voltage to set the voltage difference substantially to a second reference voltage.

The rectifier includes a transistor and a gate voltage control circuit. The transistor has a first end receiving an input voltage, a second end generating a rectified voltage, and a control end receiving a gate voltage. The gate voltage control circuit is coupled to the transistor and generates the gate voltage according to the voltage difference between the input voltage and the rectified voltage. During a first time interval after the voltage difference drops to a first preset threshold voltage, the gate voltage control circuit determines whether the voltage difference is less than a second preset threshold voltage, and decides whether to provide the gate voltage to turn on the transistor. When the transistor is turned on, during the first time interval and the second time interval which is after the first time interval, when the voltage difference rises to a third preset threshold voltage, the gate voltage is regulated to turn off the transistor. During the first time interval, the third preset threshold voltage is greater than or equal to zero. And during the second time interval, the third preset threshold voltage is less than or equal to zero.

The alternator of the present disclosure includes a rotor, a stator, and multiple rectifiers as described above. Each of the rectifiers receives a corresponding AC input voltage as the rectified voltage, and the rectifiers together generate the rectified voltage.

In light of the above, during the first time interval after the voltage difference between the input voltage and the rectified voltage drops to the relatively high first preset threshold voltage, the gate voltage control circuit of the present disclosure determines whether the voltage difference drops lower to the relatively low second preset threshold voltage, and decides accordingly whether to fully turn on the transistor. This way, the reverse current caused by turning on the transistor too slowly may be prevented, thereby improving the overall performance of the rectifiers.

DESCRIPTION OF THE EMBODIMENTS

Figure 2:
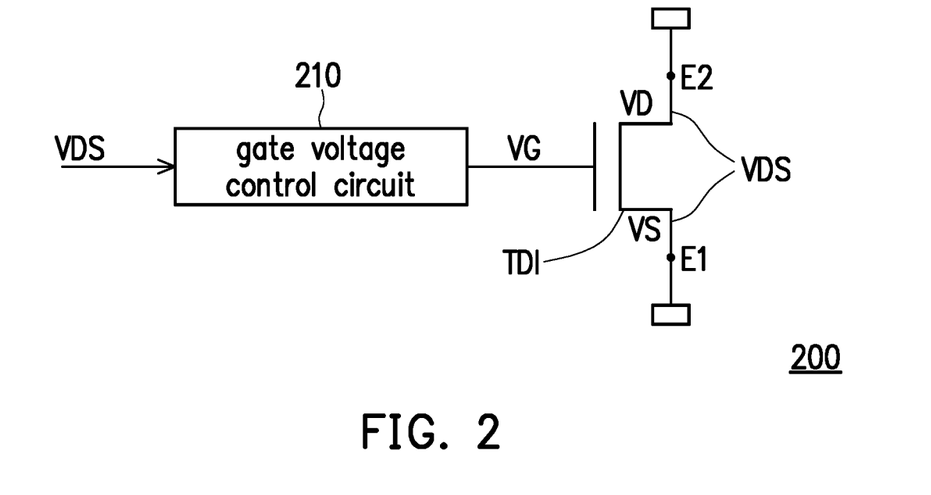
FIG. 2 is a schematic view of a rectifier according to an embodiment of the present disclosure.

FIG. 2 is a schematic view of a rectifier according to an embodiment of the present disclosure. A rectifier 200 includes a transistor TD1 and a gate voltage control circuit 210. The transistor TD1 has a first end E1 receiving an input voltage VS, a second end E2 generating a rectified voltage VD, and a control end receiving a gate voltage VG. In this embodiment, the operation of the transistor TD1 is equivalent to a diode via the gate voltage VG, in which the first end of the transistor TD1 is equivalent to the cathode of the diode, and the second end of the transistor TD1 is equivalent to the anode of the diode.

Figure 3A:
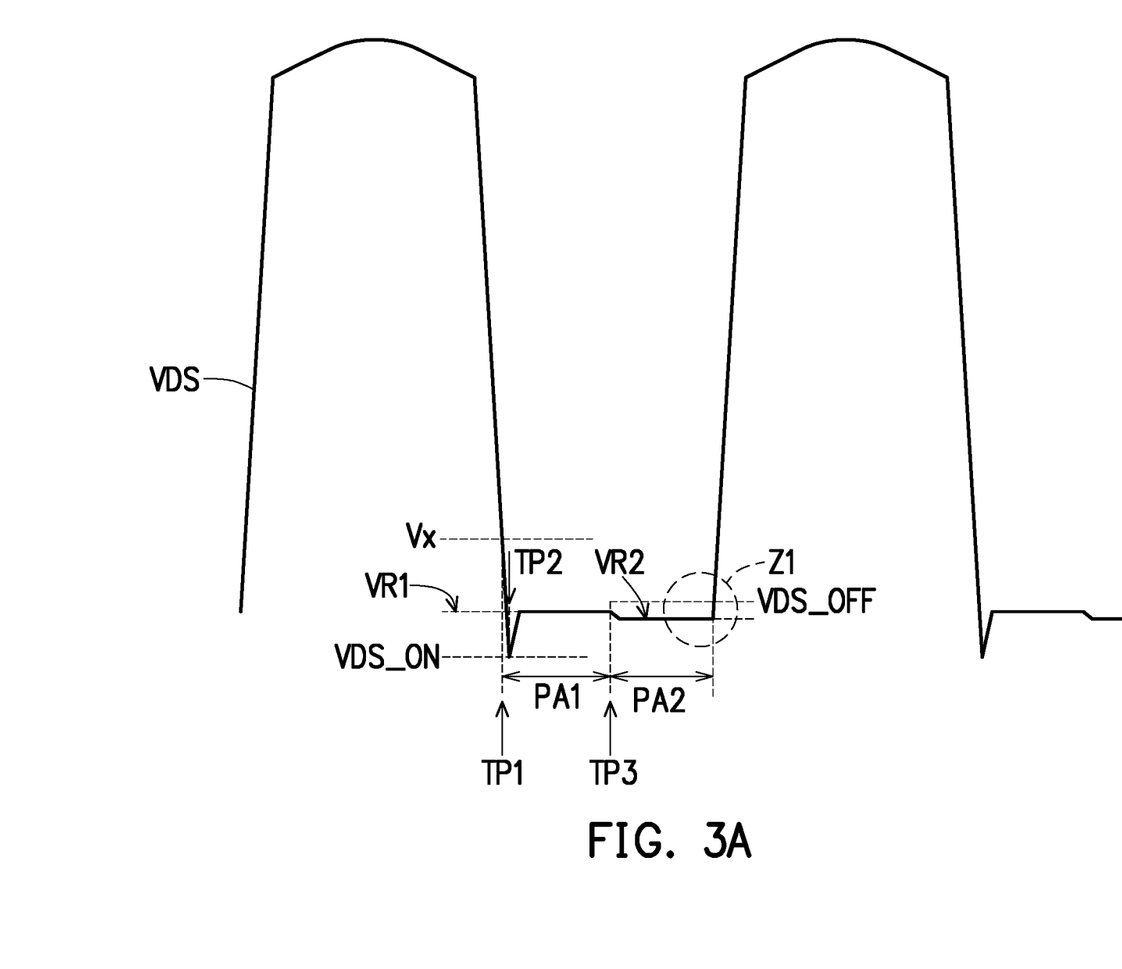
FIG. 3A is a waveform of an implementation of a rectifier according to an embodiment of the present disclosure.

The gate voltage control circuit 210 is coupled to the transistor TD1 and is adapted to provide the gate voltage VG. The gate voltage control circuit 210 receives a voltage difference VDS between the input voltage VS and the rectified voltage VD, and generates the gate voltage VG according to the voltage difference VDS. To describe the gate voltage VG in more detail, please refer to FIG. 2 and FIG. 3A at the same time. FIG. 3A is a waveform of an implementation of a rectifier according to an embodiment of the present disclosure.

In this embodiment, the gate voltage control circuit 210 detects the voltage difference VDS of the transistor TD1, and detects a time point TP1 when the voltage difference VDS drops to a first preset threshold voltage Vx. After the time point TP1, the gate voltage control circuit 210 initiates a counting operation for a first time interval PAL Then, the gate voltage control circuit 210 may determine whether the voltage difference VDS of the transistor TD1 has dropped to a second preset threshold voltage VDS_ON during the first time interval PA1, in which the second preset threshold voltage VDS_ON is less than the first preset threshold voltage Vx. In this embodiment, during the first time interval PA1, the gate voltage control circuit 210 determines a time point TP2 at which the voltage difference VDS of the transistor TD1 drops to the second preset threshold voltage VDS_ON, and the gate voltage control circuit 210 generates the gate voltage VG at the time point TP2 to turn on the transistor TD1. In this embodiment, the transistor TD1 at this time is turned on fully.

In this embodiment, when the counting operation of the first time interval PA1 is initiated, the gate voltage control circuit 210 does not turn on the transistor TD1 immediately. The gate voltage control circuit 210 continues to detect the voltage difference VDS during the first time interval PA1, and only turns on the transistor TD1 when the voltage difference VDS is determined to drop to the second preset threshold voltage VDS_ON.

Note here that in the embodiment of the present disclosure, the first time interval PA1 may be a preset, limited time interval. The first time interval PA1 may be set according to the time length of the negative half wave of the voltage difference VDS. Therefore, the later the time point TP2 when the voltage difference VDS drops to the second preset threshold voltage VDS_ON occurs, the shorter the time length for the transistor TD1 to be turned on fully. In addition, if the gate voltage control circuit 210 detects that the voltage difference VDS has not dropped to the second preset threshold voltage VDS_ON during the first time interval PA1, then the transistor TD1 is not fully turned on during this cycle.

Incidentally, taking the transistor TD1 as an N-type transistor as an example, the gate voltage control circuit 210 can provide a gate voltage VG having a voltage value high enough to turn on the transistor TD1 fully. When the transistor TD1 is turned on, via the rectification of the transistor TD1, the voltage difference VDS may be equal to a first reference voltage VR1 which is the product of the on-state resistance of the transistor TD1 and the current flowing through the transistor TD1. Take the fully turned-on transistor TD1 as an example. The on-resistance of the transistor TD1 is extremely low, such that the first reference voltage VR1 may maintain at or close to 0 volt.

Then, during a second time interval PA2 after the first time interval PA1, the gate voltage control circuit 210 sets the voltage difference VDS to a second reference voltage VR2 by regulating the gate voltage VG to adjust the equivalent resistance provided by the transistor TD1. In the embodiment, the first reference voltage VR1 may be greater than the second reference voltage VR2. However, in other embodiments of the present disclosure, the first reference voltage VR1 may also be equal to or less than the second reference voltage VR2, and the present disclosure is not limited thereto.

Figure 3B:
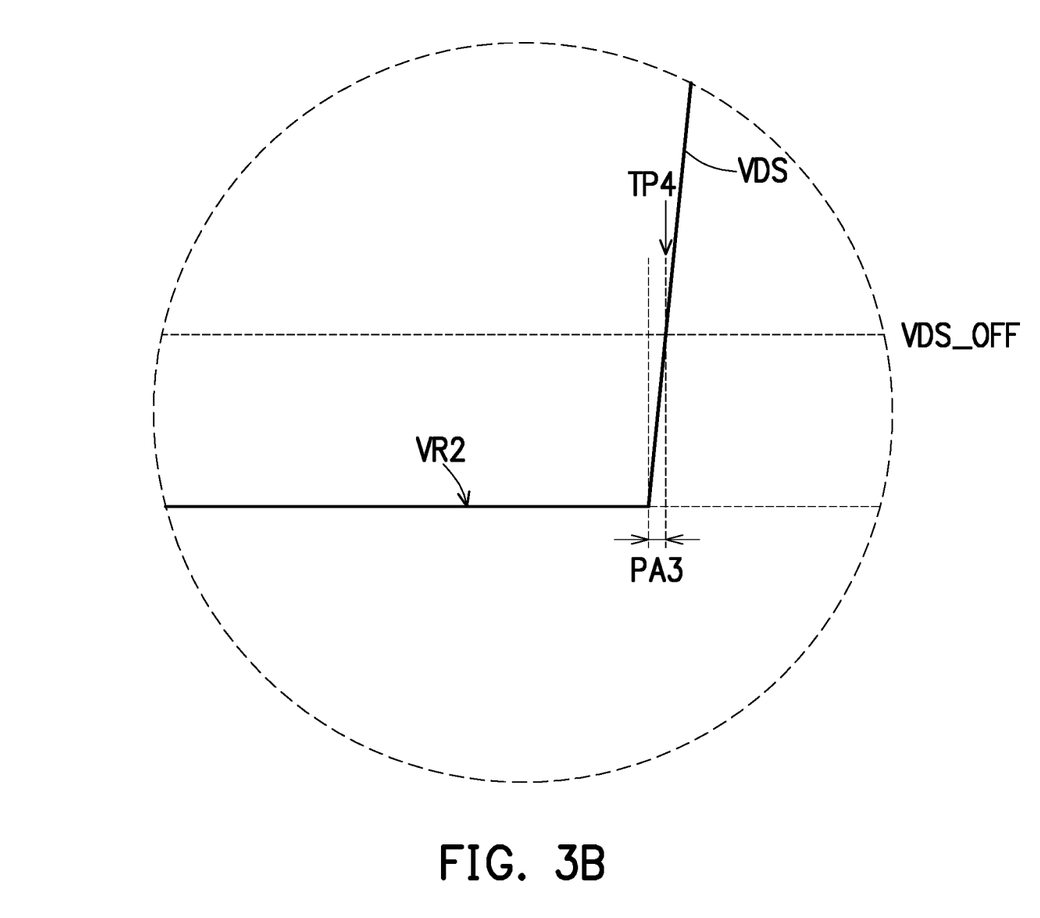
FIG. 3B is an enlarged diagram showing the zone Z1 in the waveform of FIG. 3A of the present disclosure.

FIG. 3B is an enlarged diagram showing the zone Z1 in the waveform of FIG. 3A of the present disclosure. During a third time interval PA3 after the second time interval PA2, when the gate voltage control circuit 210 detects that the voltage difference VDS rises from the second reference voltage VR2 to a third preset threshold voltage VDS_OFF, the gate voltage control circuit 210 regulates the gate voltage VG so that the transistor TD1 is turned off. In this embodiment, the gate voltage control circuit 210 regulates the gate voltage VG to a voltage value low enough to turn off the transistor TD1.

Figure 4:
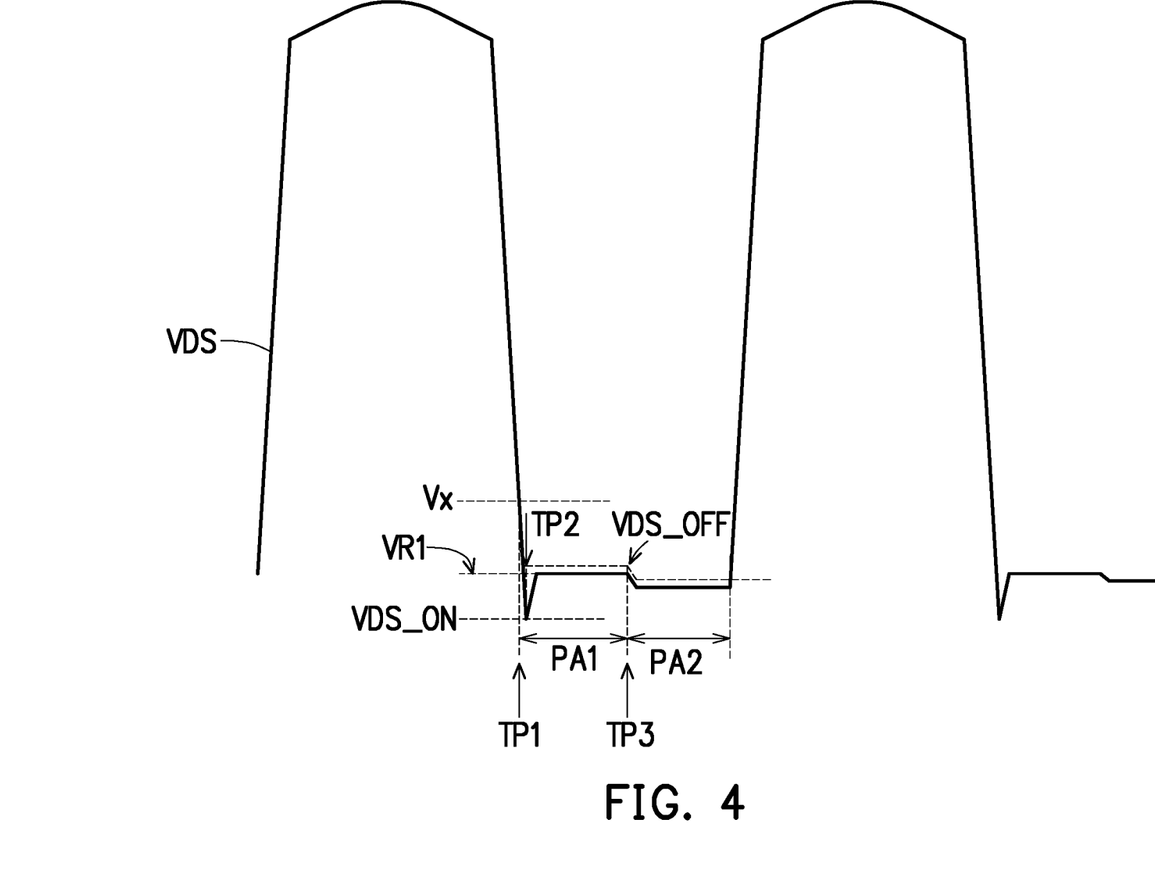
FIG. 4 is a waveform of a third preset threshold voltage of a rectifier according to an embodiment of the present disclosure.

Incidentally, please refer to FIG. 4, which illustrates a waveform of an implementation of a rectifier according to another embodiment of the present disclosure. In FIG. 4, during the first time interval PA1 and the second time interval PA2, when the gate voltage control circuit 210 detects that the voltage difference VDS rises to the third preset threshold voltage VDS_OFF, the gate voltage control circuit 210 regulates the gate voltage VG to turn off the transistor TD1. And the third preset threshold voltage VDS_OFF is regulatable. In the present embodiment, during the first time interval PA1, a third preset threshold voltage VDS_OFF is greater than or equal to zero. And during the second time interval PA2, the third preset threshold voltage VDS_OFF is less than or equal to zero.

Figure 5A:
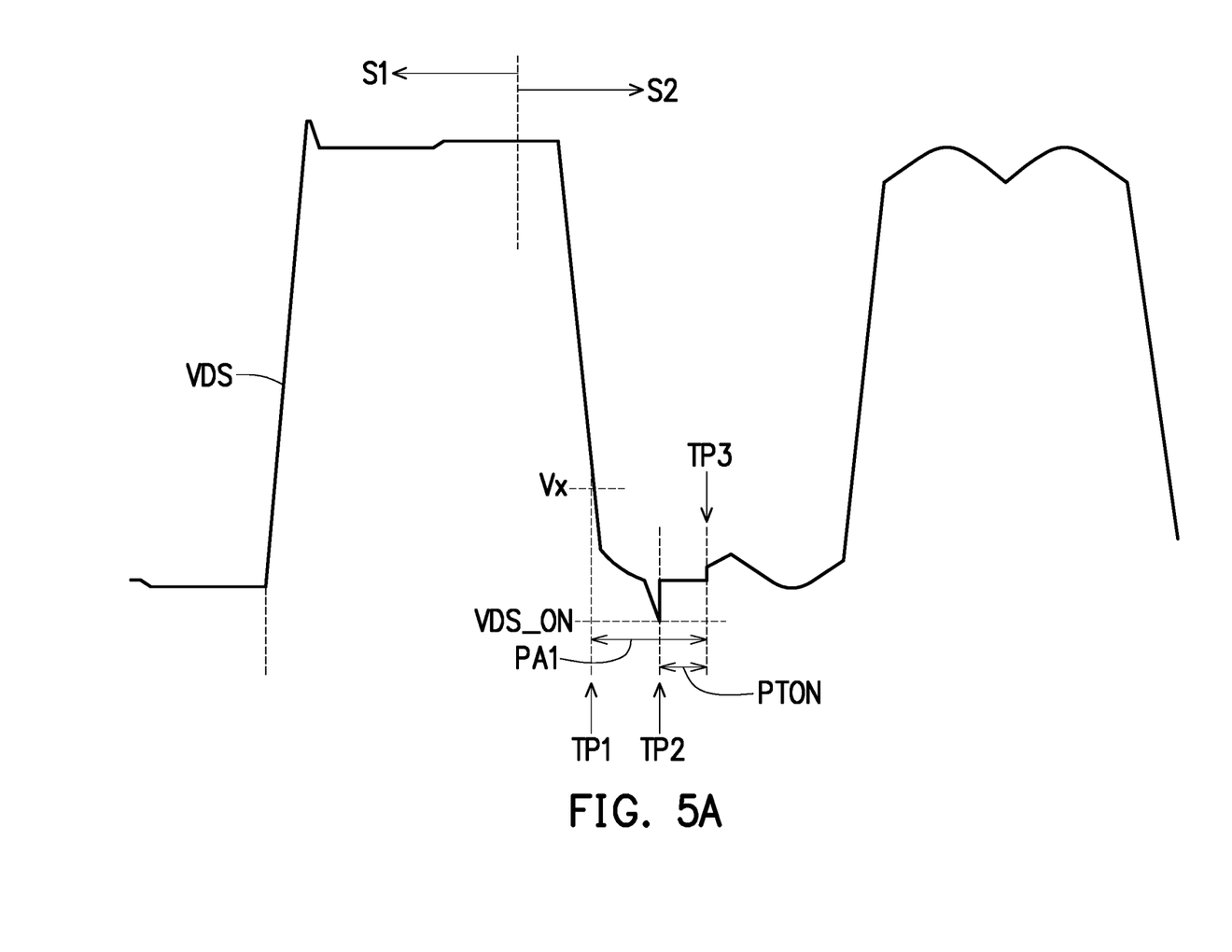
FIG. 5A and FIG. 5B are waveforms of two different implementations of rectifiers according to embodiments of the present disclosure.
Figure 5B:
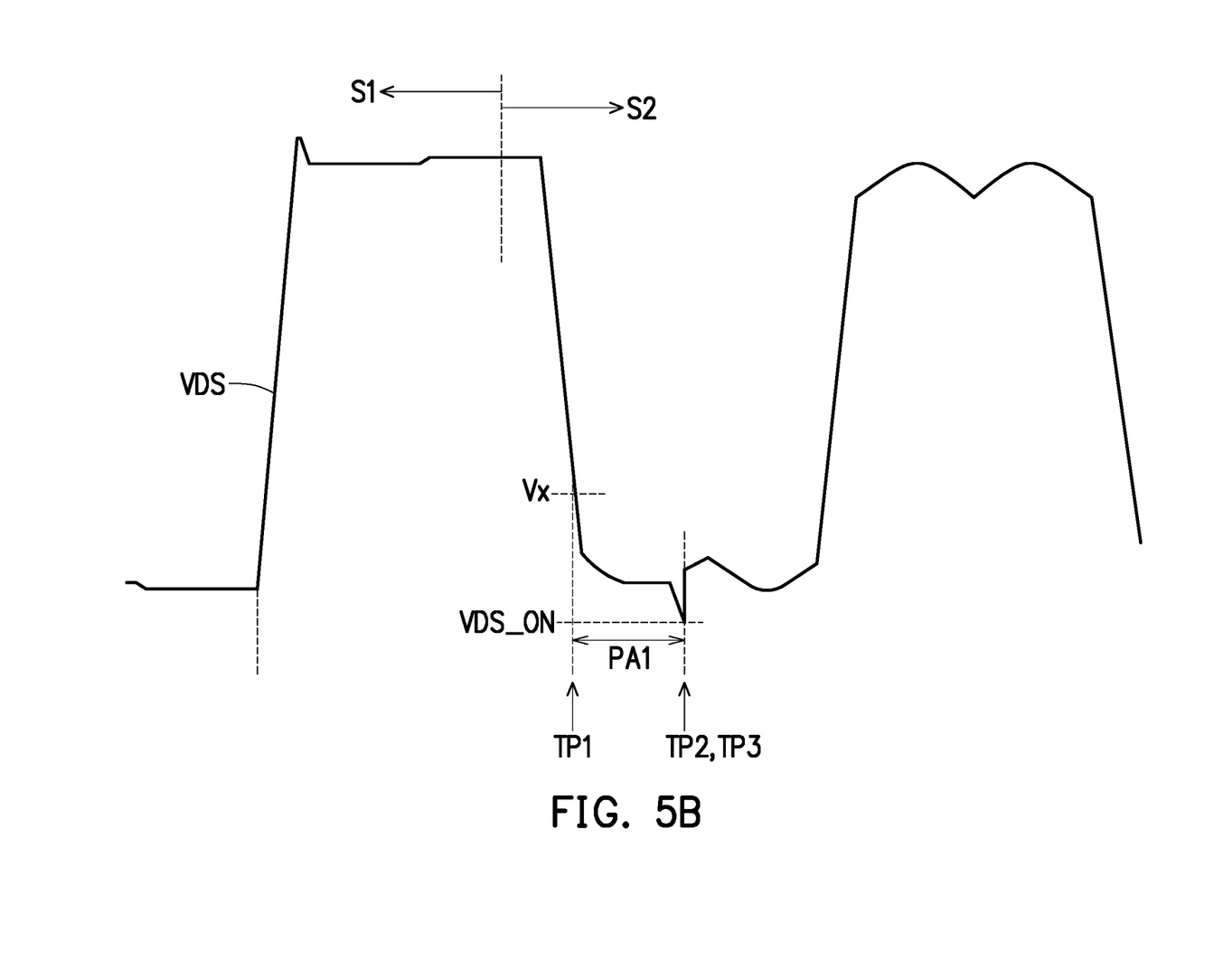

Please refer to FIG. 2, FIG. 5A, and FIG. 5B. FIG. 5A and FIG. 5B are waveforms of two different implementations of rectifiers according to embodiments of the present disclosure. In FIG. 5A, a rectifier 200 applied to the alternator is switched from a state S1 where the rectified current is greater than 0 ampere to a state S2 where the rectified current is 0 ampere. After the gate voltage control circuit 210 detects the time point TP1 when the voltage difference VDS drops to the first preset threshold voltage Vx, the gate voltage control circuit 210 performs the counting the first time interval PA1. At the time point TP2 which is after a period of time from the time point TP1, the gate voltage control circuit 210 detects that the voltage difference VDS drops to the second preset threshold voltage VDS_ON. The gate voltage control circuit 210 provides the gate voltage VG correspondingly at the time point TP2 so that the transistor TD1 is fully turned on. After a time point TP3 when the first time interval PA1 ends, the gate voltage control circuit 210 performs the counting for the second time interval. In this embodiment, a time period PION during which the transistor TD1 is fully turned on is shorter than the time period of the first time interval PA1.

In FIG. 5B, the gate voltage control circuit 210 detects that the time point TP2 at which the voltage difference VDS drops to the second preset threshold voltage VDS_ON overlaps with the time point TP3 at which the first time interval PA1 ends (or, the time point TP2 is later than the time point TP3). Therefore, in this embodiment, the transistor TD1 is not turned on fully.

It can be seen from the implementation of FIG. 5B of the present disclosure that at the time point TP2 when the voltage difference VDS drops to the second preset threshold voltage VDS_ON, the gate voltage control circuit 210 may prevent the transistor TD1 from being fully turned on at a time point relatively late in the time interval of the negative half-wave of the voltage difference VDS. This way, it may effectively reduce the possibility of generating the reverse current from the up-pull of the voltage difference VDS when the transistor TD1 is turned on fully.

Figure 6:
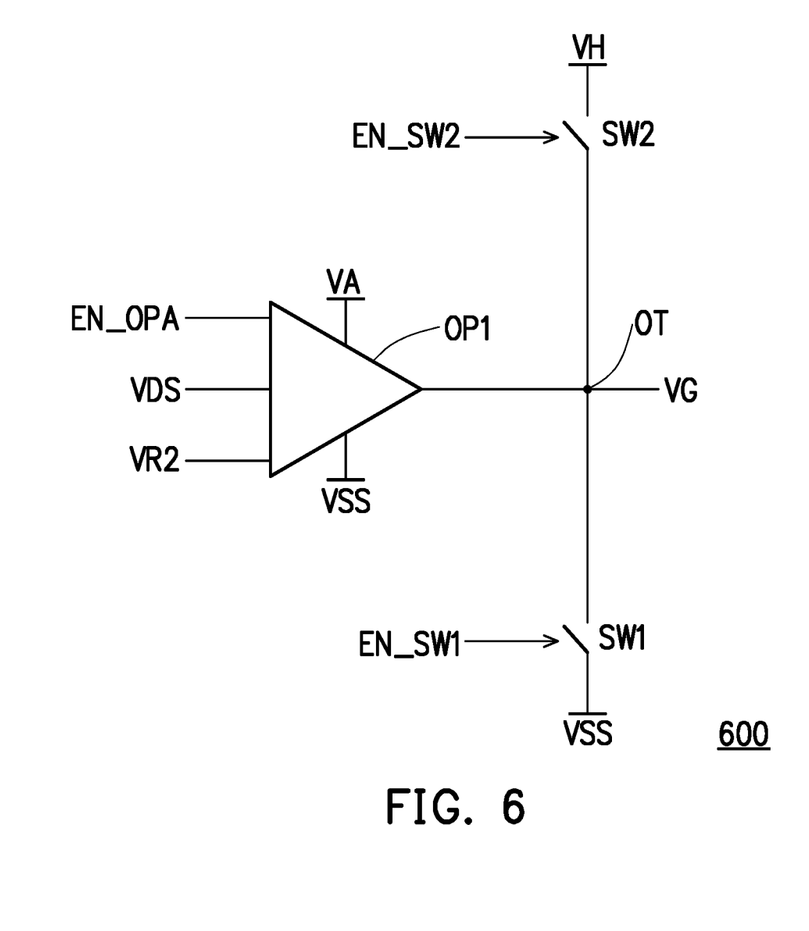
FIG. 6 is a schematic view of a gate voltage control circuit according to an embodiment of the present disclosure.

FIG. 6 is a schematic view of a gate voltage control circuit according to an embodiment of the present disclosure. A gate voltage control circuit 600 includes an operational amplifier OP1, a switch SW1, and a switch SW2. The operational amplifier OP1 receives a voltage difference VDS and an regulated voltage acting as a second reference voltage VR2, and generates a gate voltage VG at an output terminal OT according to a control signal EN_OPA to drive a corresponding transistor. In addition, the operational amplifier OP1 receives a power supply VA as an operational power supply, and receives a voltage VSS as a reference ground voltage. The switch SW2 is connected in series between an operating voltage VH and an output terminal OT. The switch SW2 is turned on or off according to a control signal EN_SW2. The switch SW1 is connected in series between the ground voltage VSS and the output terminal OT. The switch SW1 is turned on or off according to a control signal EN_SW1.

In terms of operational details, during the first time interval, the gate voltage control circuit 600 disables the operational amplifier OP1 via the control signal EN_OPA at the time point when the voltage difference VDS is less than the second preset threshold voltage, and turns on the switch SW2 via the control signal EN_SW2 to pull up the gate voltage VG to the operating voltage VH. Meanwhile, the switch SW1 is turned off according to the control signal EN_SW1. Then, during a second time interval after the first time interval, the gate voltage control circuit 600 turns off the switches SW2 and SW1 respectively via the control signals EN_SW2 and EN_SW1, and activates the operational amplifier OP1 via the control signal EN_OPA. During the second time interval, the operational amplifier OP1 controls the voltage difference VDS to equal to the second reference voltage VR2 and provides the gate voltage VG at the output terminal OT. Then, during the third time interval, the gate voltage control circuit 600 turns off the switch SW2 via the control signal EN_SW2, and disables the operational amplifier OP1 via the control signal EN_OPA. Then, during the third time interval, the gate voltage control circuit 600 turns on the switch SW1 via the control signal EN_SW1. Through the turned-on switch SW1, the gate voltage VG is pulled down to the ground voltage VSS, and the transistor correspondingly driven is turned off.

Figure 7:
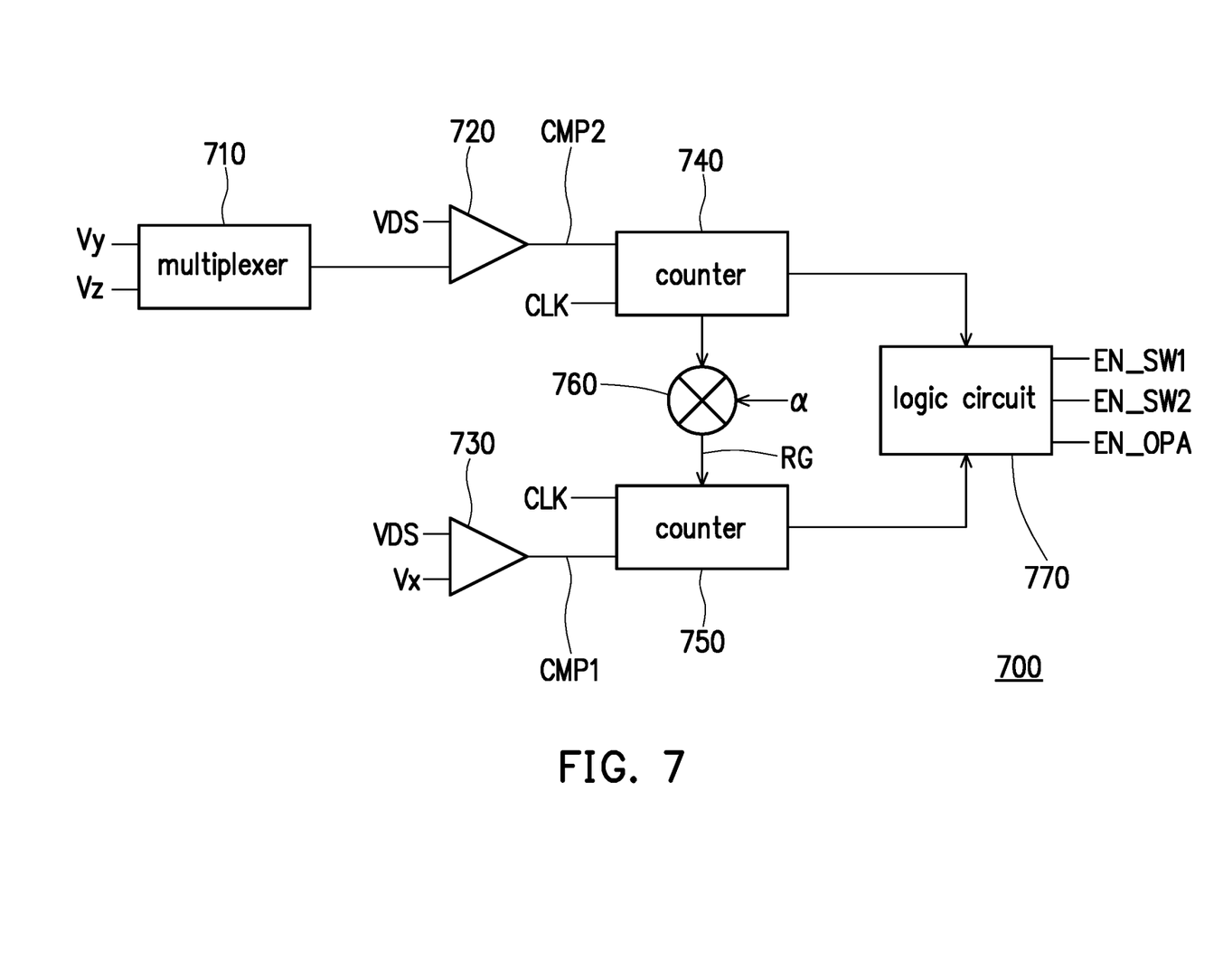
FIG. 7 is a schematic view of an implementation of a signal generator in a gate voltage control circuit according to an embodiment of the present disclosure.

Regarding the foregoing embodiments, the control signals EN_OPA, EN_SW1, and EN_SW2 may be generated by a control signal generator provided in the gate voltage control circuit 600. Regarding the implementation of the control signal generator, please refer to FIG. 7, which is a schematic view of an implementation of a signal generator in a gate voltage control circuit of an embodiment of the present disclosure. In FIG. 7, a control signal generator 700 is adapted to compare the voltage difference VDS with the first voltage Vx (which is equivalent to the first preset threshold voltage) and generate a first comparison result CMP1, and to compare the voltage difference VDS with a second voltage Vy or a third voltage Vz and generate a second comparison result CMP2. The control signal generator 700 generates control signals EN_SW1, EN_SW2, and EN_OPA according to the first comparison result CMP1 and the second comparison result CMP2. The first voltage Vx≥the third voltage Vz≥the second voltage Vy≥the second preset threshold voltage (as the second preset threshold voltage VDS_ON of the embodiment of FIG. 3), and the third voltage Vz≥the third preset threshold voltage (as the third preset threshold voltage VDS_OFF of the embodiment of FIG. 3).

In terms of implementation details, the control signal generator 700 includes a multiplexer 710, comparators 720 and 730, counters 740 and 750, a calculator 760, and a logic circuit 770. The multiplexer 710 receives the second voltage Vy and the third voltage Vz, and selects to provide the second voltage Vy or the third voltage Vz to the counter 740 according to the second comparison result CMP2. The comparator 730 receives the voltage difference VDS and the first voltage Vx, and initiates the counting operation of the counter 750 according to the comparison result CMP1 when the voltage difference VDS drops to the first voltage Vx. The counter 750 receives a counting range value RG from the calculator 760, and counts the first time interval based on a clock signal CLK according to the counting range value RG. The comparator 720 is coupled to the multiplexer 710, and the comparator 720 compares the voltage difference VDS with the voltage of the output terminal of the multiplexer 710. In its initial state, the multiplexer 710 selects to output the second voltage Vy to the comparator 720; the comparator 720 compares the second voltage Vy with the voltage difference VDS; and when the voltage difference VDS is equal to the second voltage Vy, the counter 740 initiates its counting operation. After the counter 740 initiates the counting operation, the multiplexer 710 changes to select and output the third voltage Vz to the comparator 720. When the voltage difference VDS is equal to the third voltage Vz, the comparator 720 stops the counter 740 from counting, and the count is completed. In this embodiment, the counter 740 is adapted to count the time length of the negative half wave of the voltage difference VDS, which is approximately equal to the total sum of time of the first time interval and the second time interval.

And the calculator 760 receives the time length of the negative half wave of the voltage difference VDS calculated by the counter 740, and multiplies the received time length with a parameter a to produce the counting range value RG. In this embodiment, the parameter a is a predetermined value smaller than 1.

In addition, in the embodiment of the present disclosure, the logic circuit 770 is coupled to the counters 740 and 750. When the second voltage Vy is equal to the second preset threshold voltage, and that the third voltage Vz is equal to the third preset threshold voltage, the logic circuit 770 may perform logic operation according to the counting results of the counters 740 and 750 as well as the start or halt state of the counting operation, and generate the control signals EN_OPA, EN_SW1, and EN_SW2. To put it in detail, the logic circuit 770 may recognize whether it is in the first time interval or not according to whether the counting operation of the counter 750 is completed. When the counting operation of the counter 750 has been initiated but yet to be completed, and the counting operation of the counter 740 is initiated, the logic circuit 770 may enable the control signal EN_SW2. When the counting operation of the counter 750 has been completed, and the counting operation of the counter 740 has been initiated but yet to be completed, the logic circuit 770 may enable the control signal EN_OPA. Also, when the counting operation of the counter 740 stops, the logic circuit 770 may enable the control signal EN_SW1. At most one of the control signals EN_SW1, EN_SW2, and EN_OPA is enabled.

Figure 8:
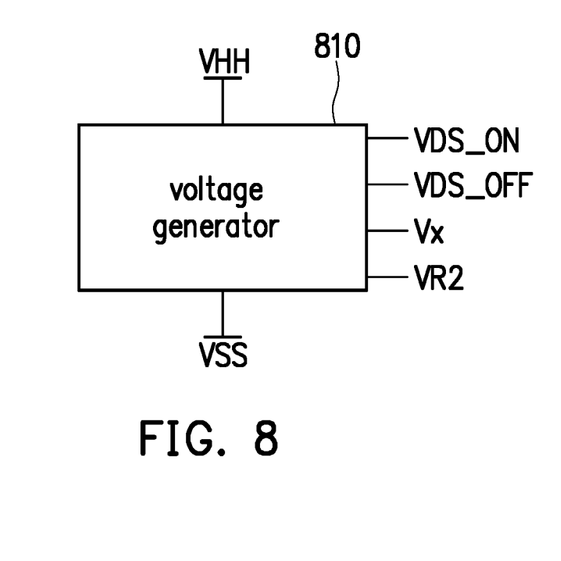
FIG. 8 is a schematic view of a voltage generator in a gate voltage control circuit according to an embodiment of the present disclosure.

On the other hand, regarding the implementations of FIG. 6 and FIG. 7 as mentioned above, the second reference voltage VR2, the first preset threshold voltage Vx, the second preset threshold voltage VDS_ON, and the third preset threshold voltage VDS_OFF may be generated by a voltage generator provided in the gate voltage control circuit 600. FIG. 8 is a schematic view of a voltage generator in a gate voltage control circuit according to an embodiment of the present disclosure. In FIG. 8, a voltage generator 810 receives an operational power supply VHH, performs a voltage regulation operation according to the operational power supply VHH, and generates the second reference voltage VR2, the first preset threshold voltage Vx, the second preset threshold voltage VDS_ON, and the third preset threshold voltage VDS_OFF. The operational power supply VHH has a relatively high voltage value, and the voltage VSS is the ground voltage. The voltage generator 810 may be a low drop-out (LDO) voltage regulator, or any other voltage regulation circuit known to those with ordinary knowledge in the art, to which there is no certain limit. The first preset threshold voltage Vx, the second preset threshold voltage VDS_ON, and the third preset threshold voltage VDS_OFF generated by the voltage generator 810 may be adapted to implement the first voltage Vx, the second voltage Vy, and the third voltage Vz in the embodiment of FIG. 7, respectively.

Figure 9:
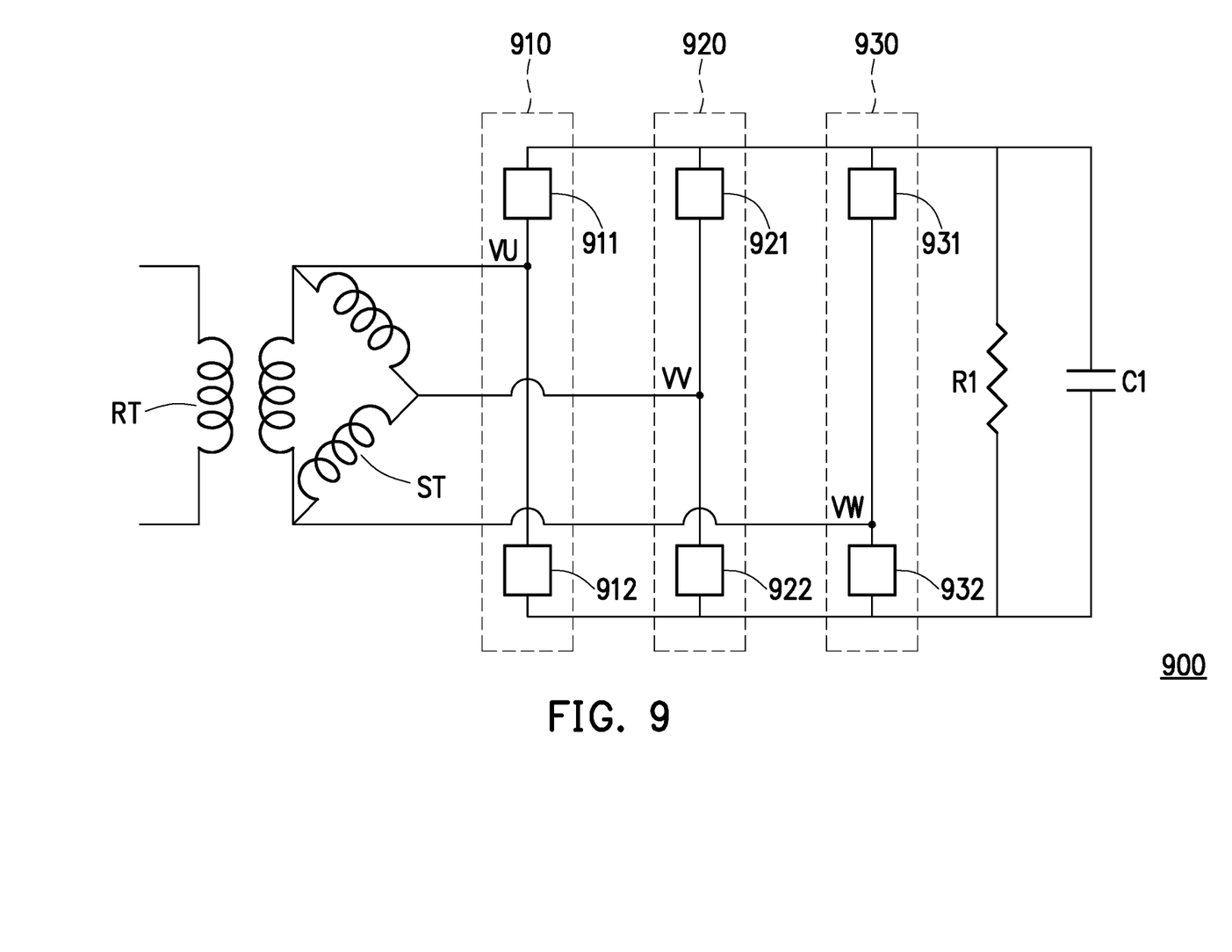
FIG. 9 is a schematic view of an alternator according to an embodiment of the present disclosure.

FIG. 9 is a schematic view of an alternator according to an embodiment of the present disclosure. An alternator 900 includes a rotor RT, a stator ST, and a plurality of rectifiers 911 to 932. In this embodiment, the stator ST generates a plurality of phase voltages VU, VV, and VW. The phase voltages VU, VV, and VW are respectively provided to a plurality of rectifier circuits 910, 920, and 930 of different phases. The rectifier circuit 910 includes rectifiers 911 and 912 coupled in series. The rectifier circuit 920 includes rectifiers 921 and 922 coupled in series. And the rectifier circuit 930 includes rectifiers 931 and 932 coupled in series. In this embodiment, the alternator 900 also includes a resistor R1 (an equivalent load or an equivalent resistance of a rechargeable battery) coupled in parallel and a capacitor C1 that is an equivalent charging capacitor to generate a rectified output voltage close to a DC voltage.

The rectifiers 911 to 932 in this embodiment may be implemented by employing the rectifier 200 of the foregoing embodiments. Relevant details have been described in the aforementioned embodiments and implementations, which will not be repeated hereinafter.

In light of the above, the rectifier of the present disclosure starts counting the first time interval according to the first preset threshold voltage, and during the first time interval, determines whether the voltage difference between the input voltage and the rectified voltage drops to the second preset threshold voltage to determine whether to turn on the transistor fully. This way, the transistor is prevented from being turned on fully at too late a time point, and it may avoid the reverse current generated from the up-pull of the voltage difference when the transistor is fully turned on. And the system is ensured of its normal operation.

What is claimed is:
1. A rectifier, comprising:
  a transistor, comprising a first end receiving an input voltage, a second end generating a rectified voltage, and a control end receiving a gate voltage; and
  a gate voltage control circuit, coupled to the transistor, and generating the gate voltage according to a voltage difference between the input voltage and the rectified voltage,
  wherein during a first time interval after the voltage difference drops to a first preset threshold voltage, the gate voltage control circuit determines whether the voltage difference is less than a second preset threshold voltage, and decides whether to provide the gate voltage to turn on the transistor, wherein when the transistor is turned on, the voltage difference substantially equals to a first reference voltage,
  wherein the gate voltage control circuit counts a time length of a negative half wave of the voltage difference, and multiplies the time length with a parameter to set the first time interval, and the parameter is a predetermined value less than 1; and
  during a second time interval after the first time interval, the gate voltage control circuit regulates the gate voltage to set the voltage difference substantially to a second reference voltage.

2. The rectifier according to claim 1, wherein the first preset threshold voltage is greater than the second preset threshold voltage, and the first reference voltage is greater than, less than, or equal to the second reference voltage.

3. The rectifier according to claim 1, wherein during the first time interval, the gate voltage control circuit provides the gate voltage to turn on the transistor when determines that the voltage difference has been less than the second preset threshold voltage.

4. The rectifier according to claim 1, wherein during the first time interval, the gate voltage control circuit provides the gate voltage to turn off the transistor when determines that the voltage difference has not been less than the second preset threshold voltage.

5. The rectifier according to claim 1, wherein during a third time interval after the second time interval, when the voltage difference rises from the second reference voltage to a third preset threshold voltage, the gate voltage control circuit regulates the gate voltage to turn off the transistor.

6. The rectifier according to claim 5, wherein the gate voltage control circuit comprises:
  an operational amplifier, receiving the voltage difference and a regulated voltage, and generating the gate voltage at an output terminal according to a first control signal;
  a first switch, connected in series between a ground voltage and the output terminal, and turned on or off according to a second control signal; and
  a second switch, connected in series between an operating voltage and the output terminal, and turned on or off according to a third control signal,
  wherein the regulated voltage is equal to the second reference voltage.

7. The rectifier according to claim 6, wherein the gate voltage control circuit further comprises:
  a control signal generator, comparing the voltage difference with a first voltage to generate a first comparison result, comparing the voltage difference with a second voltage or a third voltage to generate a second comparison result, and generating the first control signal, the second control signal, and the third control signal according to the first comparison result and the second comparison result,
  wherein the first voltage≥the third voltage≥the second voltage≥the second preset threshold voltage, the third voltage≥the third preset threshold voltage, and the first voltage is equal to the first preset threshold voltage.

8. The rectifier according to claim 7, wherein the control signal generator comprises:
a first comparator, generating the first comparison result by comparing the voltage difference with the first voltage;
a first counter, counting the first time interval based on a clock signal according to the first comparison result and a counting range value;
a multiplexer, selecting to output the second voltage or the third voltage according to the second comparison result;
a second comparator, generating the second comparison result by comparing an output of the multiplexer with the voltage difference;
a second counter, generating a counting result by performing a counting operation based on the clock signal according to the second comparison result, wherein the counting result represents a total sum of time of the first time interval and the second time interval;
a calculator, coupled between the first counter and the second counter, and multiplying the counting result by the parameter to produce the counting range value; and
a logic circuit, coupled to the first counter and the second counter, and generating the first control signal, the second control signal, and the third control signal according to the first time interval and the counting result.

9. The rectifier according to claim 8, wherein the second counter initiates the counting operation when the voltage difference drops to the second voltage, and stops the counting operation when the voltage difference rises to the third voltage.

10. The rectifier according to claim 7, wherein the gate voltage control circuit further comprises:
a voltage generator, generating the first preset threshold voltage, the second preset threshold voltage, the third preset threshold voltage, the second voltage, the third voltage, and the second reference voltage according to an operational power supply.

11. A rectifier, comprising:
a transistor, comprising a first end receiving an input voltage, a second end generating a rectified voltage, and a control end receiving a gate voltage; and
a gate voltage control circuit, coupled to the transistor, and generating the gate voltage according to a voltage difference between the input voltage and the rectified voltage,
wherein during a first time interval after the voltage difference drops to a first preset threshold voltage, the gate voltage control circuit determines whether the voltage difference is less than a second preset threshold voltage, and decides whether to provide the gate voltage to turn on the transistor, wherein when the transistor is turned on, during the first time interval and a second time interval which is after the first time interval, when the voltage difference rises to a third preset threshold voltage, the gate voltage is regulated to turn off the transistor, wherein:
during the first time interval, the third preset threshold voltage is greater than or equal to zero; and
during the second time interval, the third preset threshold voltage is less than or equal to zero,
wherein the gate voltage control circuit counts a time length of a negative half wave of the voltage difference, and multiplies the time length with a parameter to set the first time interval, and the parameter is a predetermined value less than 1.

12. The rectifier according to claim 11, wherein the gate voltage control circuit comprises:
an operational amplifier, receiving the voltage difference and a regulated voltage, and generating the gate voltage at an output terminal according to a first control signal;
a first switch, connected in series between a ground voltage and the output terminal, and turned on or off according to a second control signal;
a second switch, connected in series between an operating voltage and the output terminal, and turned on or off according to a third control signal; and
a control signal generator, comparing the voltage difference with a first voltage to generate a first comparison result, comparing the voltage difference with a second voltage or a third voltage to generate a second comparison result, and generating the first control signal, the second control signal, and the third control signal according to the first comparison result and the second comparison result,
wherein the first voltage≥the third voltage≥the second voltage≥the second preset threshold voltage, the third voltage≥the third preset threshold voltage, and the first voltage is equal to the first preset threshold voltage.

13. An alternator, comprising:
a rotor;
a stator, coupled to the rotor, and generating a plurality of AC voltages; and
rectifiers according to claim 1, wherein each of the rectifiers receives the corresponding AC voltage as the input voltage, and the rectifiers together generate the rectified voltage.

14. An alternator, comprising:
a rotor;
a stator, coupled to the rotor, and generating a plurality of AC voltages; and
rectifiers according to claim 11, wherein each of the rectifiers receives the corresponding AC voltage as the input voltage, and the rectifiers together generate the rectified voltage.

* * * * *